US009496313B2

(12) United States Patent
Edwards et al.

(10) Patent No.: US 9,496,313 B2
(45) Date of Patent: Nov. 15, 2016

(54) CMOS-BASED THERMOPILE WITH REDUCED THERMAL CONDUCTANCE

(71) Applicant: Texas Instruments Incorporated, Dallas, TX (US)

(72) Inventors: Henry Litzmann Edwards, Garland, TX (US); Toan Tran, Rowlett, TX (US); Jeffrey R. Debord, Dallas, TX (US); Ashesh Parikh, Frisco, TX (US); Bradley David Sucher, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/292,198

(22) Filed: May 30, 2014

(65) Prior Publication Data

US 2015/0349022 A1 Dec. 3, 2015

(51) Int. Cl.
*H01L 29/66* (2006.01)
*H01L 27/16* (2006.01)
*H01L 35/04* (2006.01)
*H01L 21/265* (2006.01)
*H01L 27/06* (2006.01)
*H01L 27/092* (2006.01)
*H01L 21/8238* (2006.01)

(52) U.S. Cl.
CPC ......... *H01L 27/16* (2013.01); *H01L 21/26513* (2013.01); *H01L 27/0617* (2013.01); *H01L 35/04* (2013.01); *H01L 21/823878* (2013.01); *H01L 27/092* (2013.01)

(58) Field of Classification Search
CPC ....... H01L 21/76; H01L 27/16; H01L 35/10; H01L 35/00; H01L 35/04; H01L 35/32
See application file for complete search history.

(56) References Cited

U.S. PATENT DOCUMENTS

| 8,674,413 B1* | 3/2014 | Chi ...................... H01L 27/0924 257/213 |
| 2010/0032748 A1* | 2/2010 | Edwards ........... H01L 21/82381 257/327 |
| 2011/0023929 A1* | 2/2011 | Edwards ................ H01L 35/32 136/212 |

FOREIGN PATENT DOCUMENTS

JP 2007243010 A * 9/2007

* cited by examiner

*Primary Examiner* — Zandra Smith
*Assistant Examiner* — Evan Clinton
(74) *Attorney, Agent, or Firm* — Michael A. Davis, Jr.; Frank D. Cimino

(57) ABSTRACT

An integrated circuit containing CMOS transistors and an embedded thermoelectric device is formed by forming isolation trenches in a substrate, concurrently between the CMOS transistors and between thermoelectric elements of the embedded thermoelectric device. Dielectric material is formed in the isolation trenches to provide field oxide which laterally isolates the CMOS transistors and the thermoelectric elements. Germanium is implanted into the substrate in areas for the thermoelectric elements, and the substrate is subsequently annealed, to provide a germanium density of at least 0.10 atomic percent in the thermoelectric elements between the isolation trenches. The germanium may be implanted before the isolation trenches are formed, after the isolation trenches are formed and before the dielectric material is formed in the isolation trenches, and/or after the dielectric material is formed in the isolation trenches.

5 Claims, 20 Drawing Sheets

CMOS-BASED THERMOPILE WITH REDUCED THERMAL CONDUCTANCE

CROSS-REFERENCE TO RELATED APPLICATIONS

The following co-pending patent applications are related and hereby incorporated by reference in their entirety: U.S. patent application Ser. No. 14/292,119 (issued as U.S. Pat. No. 9,231,025), and U.S. patent application Ser. No. 14/292,281, and U.S. patent application Ser. No. 14/957,314. With their mention in this section, these patent applications are not admitted to be prior art with respect to the present invention.

BACKGROUND

The disclosures herein relate to integrated circuits, and in particular, to a CMOS based thermopile with reduced thermal conductance.

Thermoelectric devices which are fabricated as parts of integrated circuits, in which the thermoelectric elements are formed of silicon, tend to have poor performance due to thermal conduction through the thermoelectric elements, reducing the temperature difference across the thermoelectric elements.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing complementary metal oxide semiconductor (CMOS) transistors and an embedded thermoelectric device are formed by forming isolation trenches in a substrate, concurrently between the CMOS transistors and between thermoelectric elements of the embedded thermoelectric device. Dielectric material is formed in the isolation trenches to provide field oxide which laterally isolates the CMOS transistors and the thermoelectric elements. Germanium is implanted into the substrate in areas for the thermoelectric elements, and the substrate is subsequently annealed, to provide a germanium density of at least 0.10 atomic percent in the thermoelectric elements between the isolation trenches. The germanium may be implanted before the isolation trenches are formed, after the isolation trenches are formed and before the dielectric material is formed in the isolation trenches, and/or after the dielectric material is formed in the isolation trenches.

DETAILED DESCRIPTION

The attached figures are not drawn to scale and they are provided merely to illustrate. Several aspects are described below with reference to example applications for illustration. It should be understood that numerous specific details, relationships, and methods are set forth to provide an understanding of the examples. One skilled in the relevant art, however, will readily recognize one or more of the specific details or with other methods may not be necessary. In other instances, well-known structures or operations are not shown in detail. The disclosures are not limited by the illustrated ordering of acts or events, as some acts may occur in different orders and/or concurrently with other acts or events. Furthermore, not all illustrated acts or events are required to implement a methodology.

An integrated circuit containing CMOS transistors and an embedded thermoelectric device are formed by forming isolation trenches in a substrate, concurrently between the CMOS transistors and between thermoelectric elements of the embedded thermoelectric device. Dielectric material is formed in the isolation trenches to provide field oxide for the CMOS transistors and thermal isolation for the thermoelectric elements. Germanium is implanted into the substrate in areas for the thermoelectric elements, and the substrate is subsequently annealed, to provide a germanium density of at least 0.10 atomic percent throughout the thermoelectric elements between the isolation trenches. The germanium may be implanted before the isolation trenches are formed, after the isolation trenches are formed and before the dielectric material is formed in the isolation trenches, and/or after the dielectric material is formed in the isolation trenches.

Figure 1:
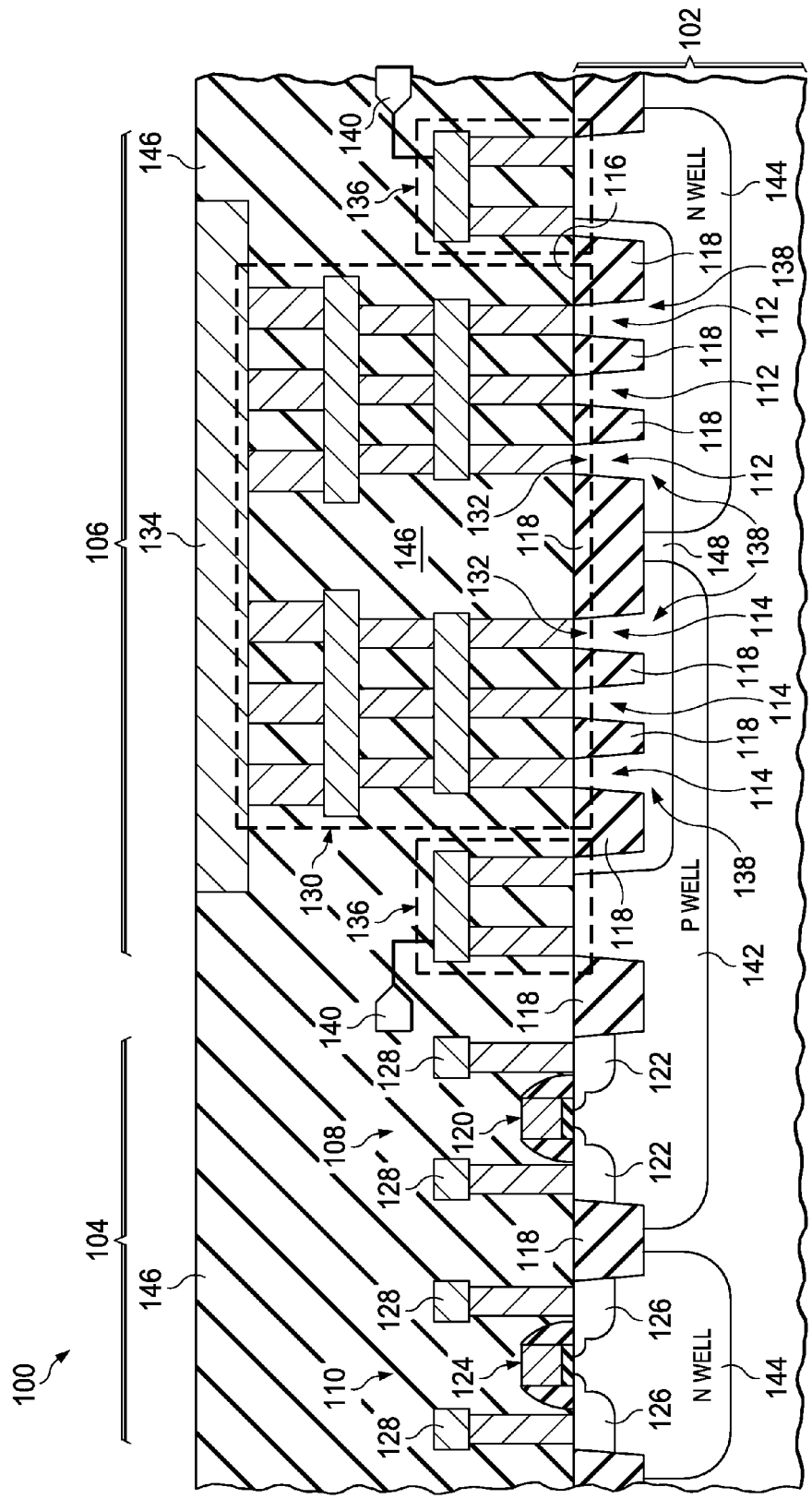
FIG. 1 is a cross section of an example integrated circuit containing CMOS transistors and an embedded thermoelectric device.

FIG. 1 is a cross section of an example integrated circuit containing CMOS transistors and an embedded thermoelectric device. The integrated circuit 100 is formed on a substrate 102 including silicon-based semiconductor material which may be for example a single crystal bulk silicon wafer or a silicon wafer with a silicon epitaxial layer. The integrated circuit 100 includes an area for the CMOS transistors 104 and an area for the embedded thermoelectric device 106. The CMOS transistors 104 include an n-channel metal oxide semiconductor (NMOS) transistor 108 and a p-channel metal oxide semiconductor (PMOS) transistor 110. The embedded thermoelectric device 106 includes n-type thermoelectric elements 112 and p-type thermoelectric elements 114 in the substrate 102, extending to a top surface 116 of the substrate 102. The n-type thermoelectric elements 112 and p-type thermoelectric elements 114 are less than 300 nanometers wide at a narrowest position, for example at the top surface 116 of the substrate 102. The integrated circuit 100 includes field oxide 118 in isolation trenches laterally isolating the NMOS transistor 108, the PMOS transistor 110, the n-type thermoelectric elements 112 and p-type thermoelectric elements 114. The field oxide 118 may be formed by a shallow trench isolation (STI) process.

The NMOS transistor 108 includes a gate structure 120 over the substrate 102 and n-type source/drain regions 122 in the substrate 102 adjacent to and partially underlapping the gate structure 120. The PMOS transistor 110 includes a gate structure 124 over the substrate 102 and p-type source/drain regions 126 in the substrate 102 adjacent to and partially underlapping the gate structure 124. Metal interconnects 128 provide electrical connections to the n-type source/drain regions 122 and the p-type source/drain regions 126.

The embedded thermoelectric device 106 includes a metal interconnect structure 130 which connects upper ends 132 of the n-type thermoelectric elements 112 and the p-type thermoelectric elements 114, electrically and thermally, to a thermal node 134. The thermal node 134 may be, for example, an interconnect element in a top layer of metallization of the integrated circuit 100 as depicted in FIG. 1. The embedded thermoelectric device 106 may also include thermal taps 136 which connect lower ends 138 of the n-type thermoelectric elements 112 and the p-type thermoelectric elements 114, electrically and thermally, to terminals 140 of the embedded thermoelectric device 106. The thermal taps 136 have low thermal impedances to the substrate 102 under and adjacent to the n-type thermoelectric elements 112 and the p-type thermoelectric elements 114, so that energy release by charge carriers from the type thermoelectric elements 112 and 114 entering the metal interconnects in the thermal taps 136 does not disadvantageously cause significant thermal drops which reduce performance of the embedded thermoelectric device 106.

The NMOS transistor 108 and the p-type thermoelectric elements 114 are disposed in one or more p-type wells 142. The p-type well 142 of the NMOS transistor 108 and the p-type well 142 of the p-type thermoelectric elements 114 may be the same p-type well 142 as depicted in FIG. 1, or may be separate. The PMOS transistor 110 and the n-type thermoelectric elements 112 are disposed in one or more n-type wells 144. The n-type well 144 of the PMOS transistor 110 and the n-type well 144 of the n-type thermoelectric elements 112 may be separate as depicted in FIG. 1, or may be the same n-type well 144.

A dielectric layer stack 146 is formed over the substrate 102 as part of a back-end-of-line (BEOL) structure of the integrated circuit 100. The dielectric layer stack 146 may include a pre-metal dielectric (PMD) layer and a plurality of inter-metal dielectric (IMD) layers and intra-level dielectric (ILD) layers. The dielectric layer stack 146 may include silicon dioxide, boron-phosphorus silicate glass (BPSG), low-k dielectric materials, and possibly silicon nitride and/or silicon carbide nitride cap layers and etch stop layers. The metal interconnects 128 on the NMOS and PMOS transistors 108 and 110, and the metal interconnect structure 130 and the thermal taps 136 of the embedded thermoelectric device 106 are disposed in the dielectric layer stack 146.

The n-type thermoelectric elements 112 and the p-type thermoelectric elements 114 are disposed in a germanium implanted region 148 which has at least 0.10 atomic percent germanium in the n-type thermoelectric elements 112 and the p-type thermoelectric elements 114. In some versions of the instant example, the germanium implanted region 148 may have at least 3 atomic percent germanium in the n-type thermoelectric elements 112 and the p-type thermoelectric elements 114. The germanium implanted region 148 may extend below the field oxide 118 as depicted in FIG. 1, or may be substantially coextensive with the n-type thermoelectric elements 112 and the p-type thermoelectric elements 114. Having at least 0.10 atomic percent germanium in the n-type thermoelectric elements 112 and the p-type thermoelectric elements 114 reduces thermal conduction between the upper ends 132 and the lower ends 138 of the n-type thermoelectric elements 112 and the p-type thermoelectric elements 114, advantageously improving performance of the embedded thermoelectric device 106. Having at least 3 atomic percent germanium in the n-type thermoelectric elements 112 and the p-type thermoelectric elements 114 further reduces thermal conduction between the upper ends 132 and the lower ends 138 of the n-type thermoelectric elements 112 and the p-type thermoelectric elements 114, advantageously improving performance of the embedded thermoelectric device 106 more than embedded thermoelectric devices with less than 3 atomic percent germanium.

Figure 2A:
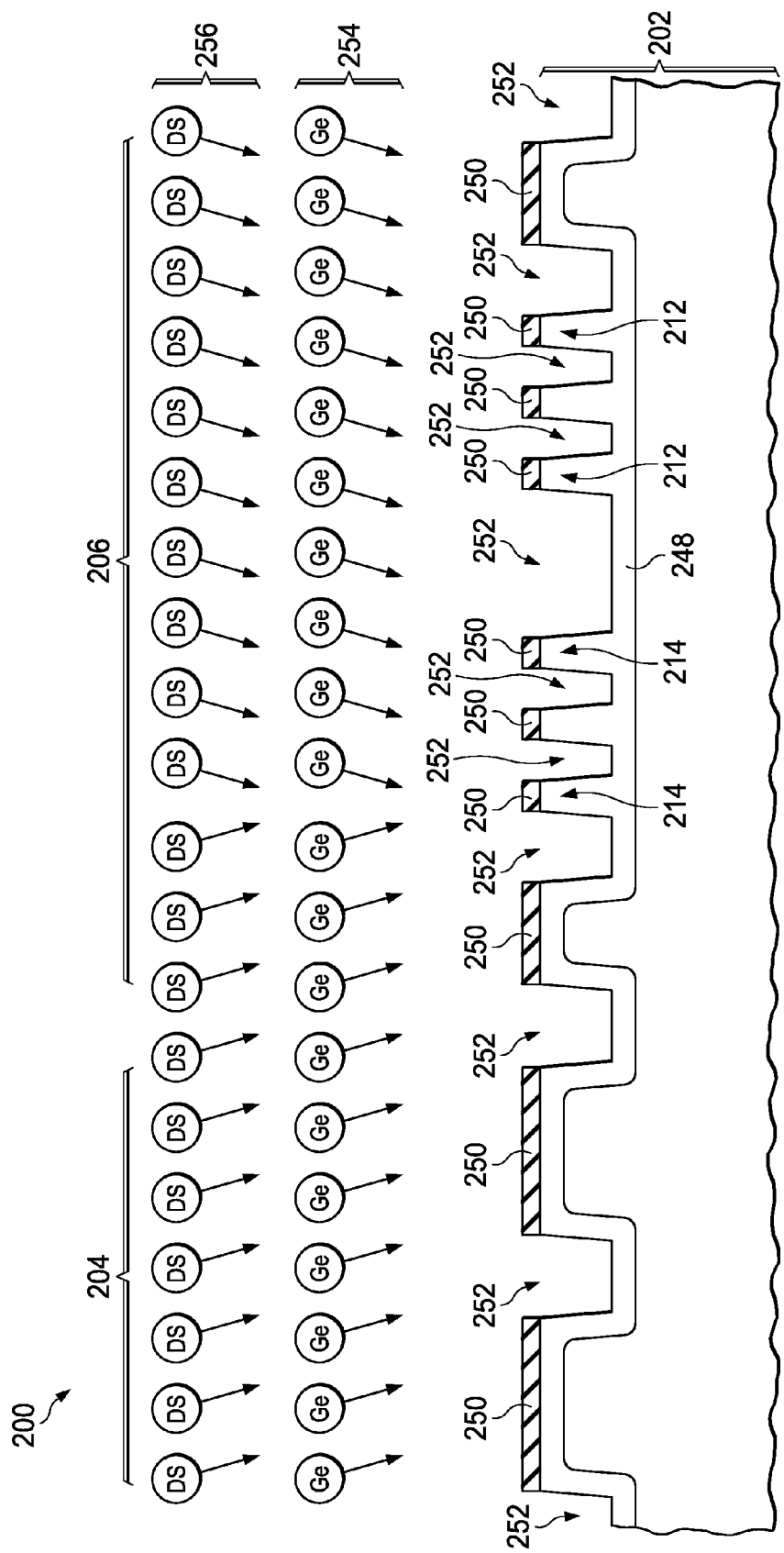
FIG. 2A through FIG. 2G are cross sections of another example integrated circuit containing CMOS transistors and an embedded thermoelectric device, depicted in successive stages of an example fabrication sequence.

FIG. 2A through FIG. 2G are cross sections of another example integrated circuit containing CMOS transistors and an embedded thermoelectric device, depicted in successive stages of an example fabrication sequence. Referring to FIG. 2A, the integrated circuit 200 is formed on a substrate 202 including silicon-based semiconductor material. The substrate 202 may be substantially all silicon, with dopants such as boron or phosphorus at an average density of $1\times10^{16}$ cm$^{-3}$ to $1\times10^{18}$ cm$^{-3}$ proximate to a top surface 216 of the substrate 202. The integrated circuit 200 includes an area for the CMOS transistors 204 and an area for the embedded thermoelectric device 206. An isolation hard mask 250 is formed over the substrate 202 so as to cover active areas of the integrated circuit 200 and expose areas for subsequently-formed field oxide. The isolation hard mask 250 may include a layer of pad oxide, 5 nanometers to 20 nanometers thick, formed by thermal oxidation at the top surface 216, and a layer of silicon nitride, 50 nanometers to 150 nanometers thick, formed by low pressure chemical vapor deposition (LPCVD), on the layer of pad oxide. Isolation trenches 252 are formed in the substrate 202 in areas exposed by the isolation hard mask 250. The isolation trenches 252 are 200 nanometers to 500 nanometers deep in the substrate 202, formed by a timed reactive ion etch (RIE) process. Thermal oxide may be formed at exposed sides and bottom surfaces of the isolation trenches 252 to electrically passivate the surfaces. The active areas include areas for n-type thermoelectric elements 212 and p-type thermoelectric elements 214 of the embedded thermoelectric device 206. The n-type thermoelectric elements 212 and p-type thermoelectric elements 214 are less than 300 nanometers wide at a narrowest position, for example at the top surface 216 of the substrate 202. Forming the n-type thermoelectric elements 212 and p-type thermoelectric elements 214 concurrently with the isolation trenches 252 in the area for the CMOS transistors 204 advantageously reduces fabrication cost and complexity of the integrated circuit 200.

Germanium 254 is implanted into the substrate 202 to form a germanium implanted region 248 along the exposed sides and bottom surfaces of the isolation trenches 252 and possibly under the isolation hard mask 250. The germanium 254 is implanted with a dose sufficient to provide at least 0.10 atomic percent germanium in active areas for subsequently-formed n-type and p-type thermoelectric elements of the embedded thermoelectric device 206. The germanium 254 may be implanted with a dose sufficient to provide at least 3 atomic percent germanium in the active areas for the n-type and p-type thermoelectric elements 212 and 214. The germanium 254 may be implanted in four rotated steps at a tilt angle of 15 degrees to 45 degrees, as depicted in FIG. 2A, to increase an implanted concentration of the germanium 254 on the exposed sides of the isolation trenches 252. The germanium 254 may further be implanted in several steps at different energies to provide a more uniform distribution of the germanium 254 in the germanium implanted region 248.

A diffusion suppressant species 256 such as carbon and/or fluorine, may optionally be implanted into the substrate 202 along the exposed sides and bottom surfaces of the isolation trenches 252 to reduce diffusion of the germanium 254 during a subsequent anneal process. The diffusion suppressant species 256 may be implanted at a total dose of $1 \times 10^{14}$ cm$^{-2}$ to $1 \times 10^{16}$ cm$^{-2}$ to provide a density of at least $1 \times 10^{20}$ cm$^{-3}$ in the active areas for the n-type and p-type thermoelectric elements 212 and 214.

Figure 2B:
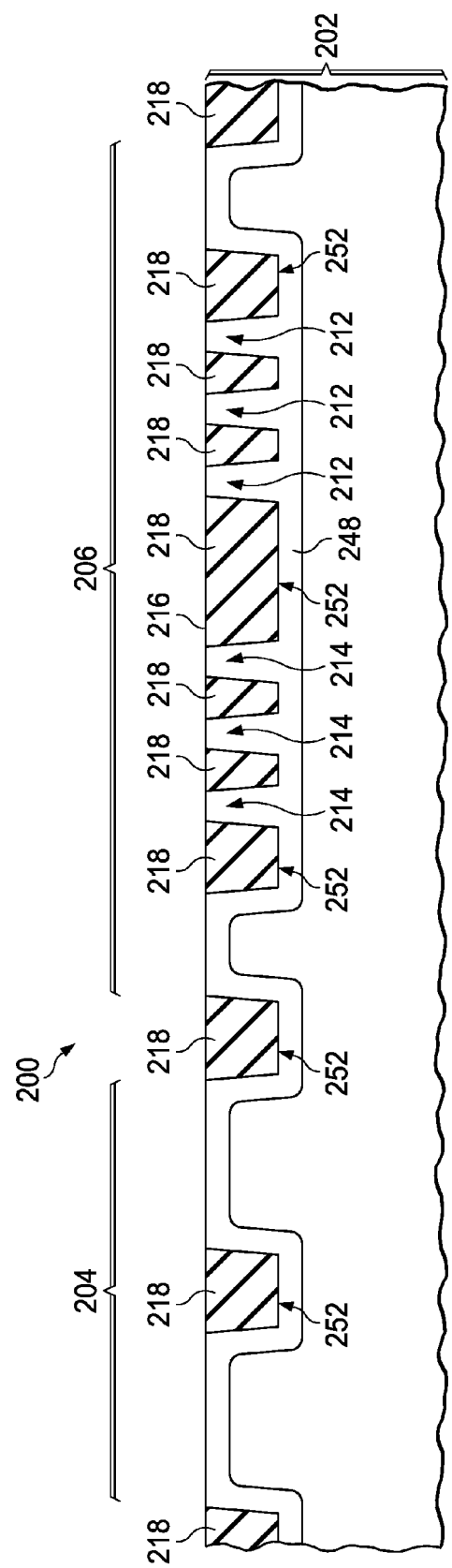

Referring to FIG. 2B, dielectric material is formed in the isolation trenches 252 and over the isolation hard mask 250 of FIG. 2A. The dielectric material may include one or more layers of silicon dioxide, and possibly silicon oxynitride and/or silicon nitride. The dielectric material may be formed by an atmospheric pressure chemical deposition (APCVD) process, a sub-atmospheric pressure chemical deposition (SACVD) process, a high density plasma (HDP) process, or a chemical vapor deposition process using ozone and tetraethyl orthosilicate (TEOS) referred to as a high aspect ratio process (HARP). The dielectric material is planarized, for example by a chemical mechanical polish (CMP) process so that a top surface of the dielectric material is substantially coplanar with the top surface 216 of the substrate 202. The isolation hard mask 250 is removed, leaving the dielectric material in the isolation trenches 252 to provide field oxide 218 laterally isolating active areas of the integrated circuit 200.

Figure 2C:
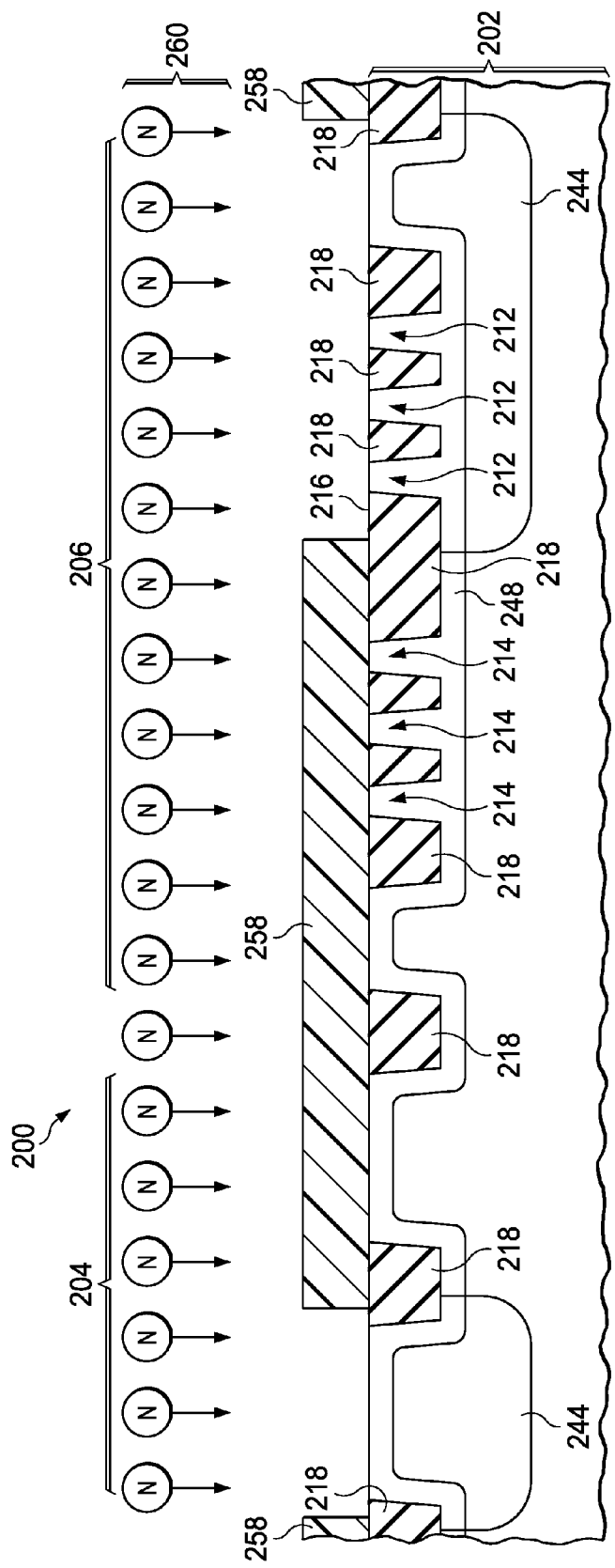

Referring to FIG. 2C, an n-type well mask 258 is formed over the substrate 202 so as to expose areas for n-type wells in the area for the CMOS transistors 204 and the n-type thermoelectric elements 212 in the area for the embedded thermoelectric device 206. The n-type well mask 258 may include photoresist formed by a photolithographic process. N-type dopants 260 such as phosphorus and arsenic are implanted into the substrate 202 in areas exposed by the n-type well mask 258. The n-type dopants 260 may be implanted at a total dose of $2 \times 10^{13}$ cm$^{-2}$ to $2 \times 10^{14}$ cm$^{-2}$ and energies of 40 keV to 500 keV. The n-type well mask 258 is subsequently removed, for example by an ash process followed by a wet clean process using an aqueous mixture of sulfuric acid and hydrogen peroxide. After the n-type well mask 258 is removed, the substrate 202 is annealed so as to activate the implanted n-type dopants 260 to form n-type wells 244. Forming the n-type wells 244 concurrently in the area for the CMOS transistors 204 and the n-type thermoelectric elements 212 in the area for the embedded thermoelectric device 206 advantageously reduces fabrication cost and complexity of the integrated circuit 200.

Figure 2D:
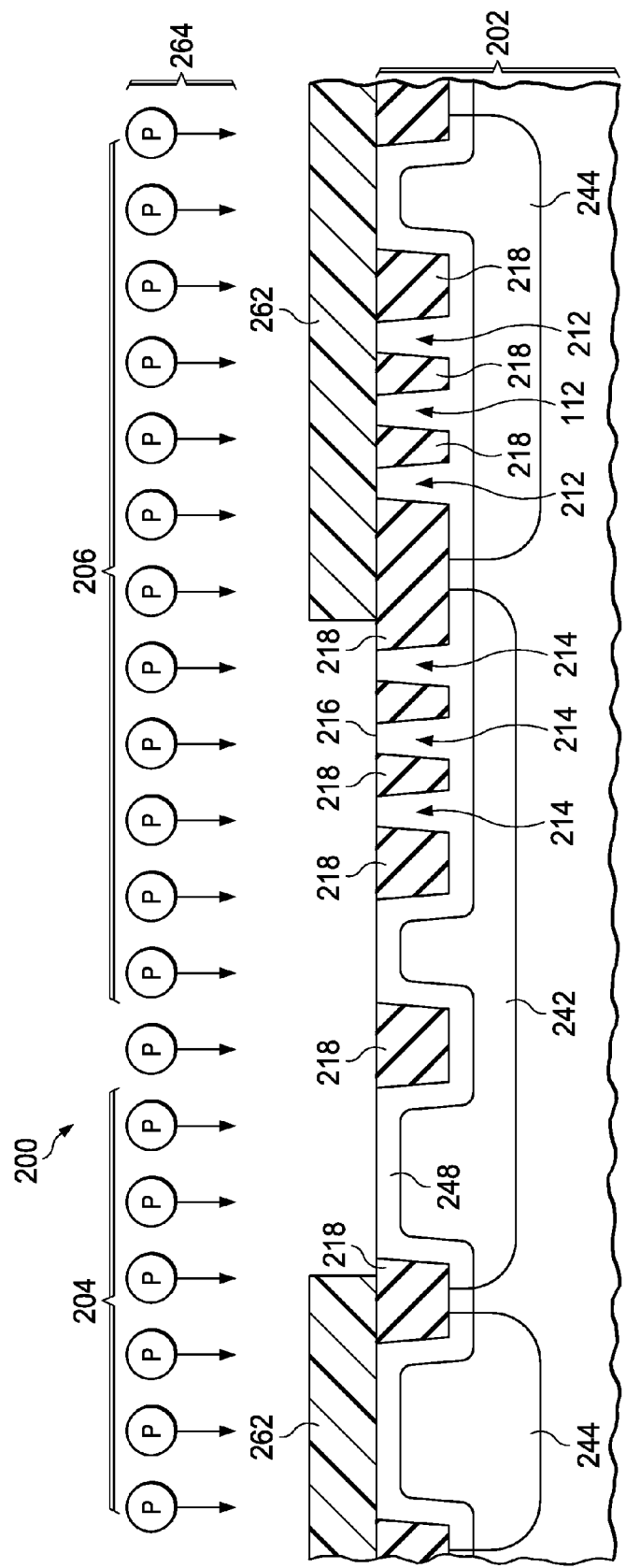

Referring to FIG. 2D, a p-type well mask 262 is formed over the substrate 202 so as to expose areas for p-type wells in the area for the CMOS transistors 204 and the p-type thermoelectric elements 214 in the area for the embedded thermoelectric device 206. The p-type well mask 262 may be formed similarly to the n-type well mask 258 of FIG. 2C.

P-type dopants 264 such as boron and indium are implanted into the substrate 202 in areas exposed by the p-type well mask 262. The p-type dopants 264 may be implanted at a total dose of $2 \times 10^{13}$ cm$^{-2}$ to $2 \times 10^{14}$ cm$^{-2}$ and energies of 10 keV to 250 keV. The p-type well mask 262 is subsequently removed as described in reference to FIG. 2C. After the p-type well mask 262 is removed, the substrate 202 is annealed so as to activate the implanted p-type dopants 264 to form p-type wells 242. The anneal process to activate the implanted p-type dopants 264 may be concurrent with the anneal process to activate the implanted n-type dopants 260 of FIG. 2C. Forming the p-type wells 242 concurrently in the area for the CMOS transistors 204 and the p-type thermoelectric elements 214 in the area for the embedded thermoelectric device 206 advantageously reduces fabrication cost and complexity of the integrated circuit 200.

Figure 2E:
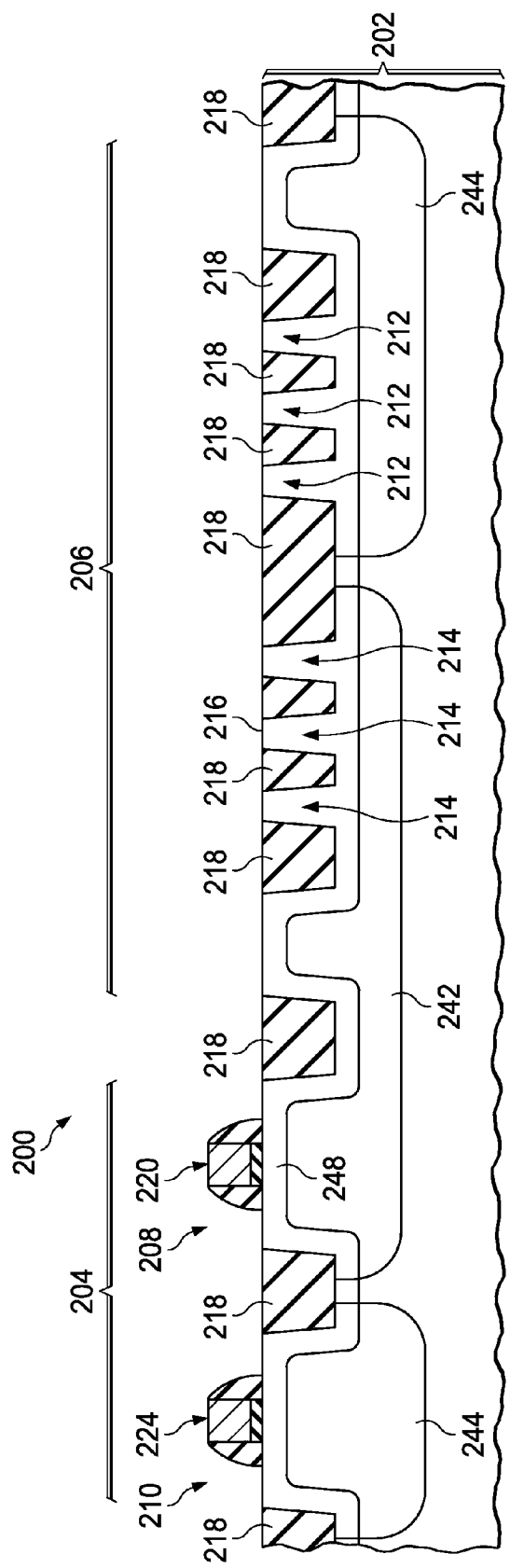

Referring to FIG. 2E, a gate structure 220 of an NMOS transistor 208 and a gate structure 224 of a PMOS transistor 210 are formed over the substrate in the area for the CMOS transistors 204. The gate structure 220 of the NMOS transistor 208 is formed over the p-type well 242, and the gate structure 224 of the PMOS transistor 210 is formed over the n-type well 244. Parts or all of the gate structures 220 and 224 may be formed concurrently.

Figure 2F:
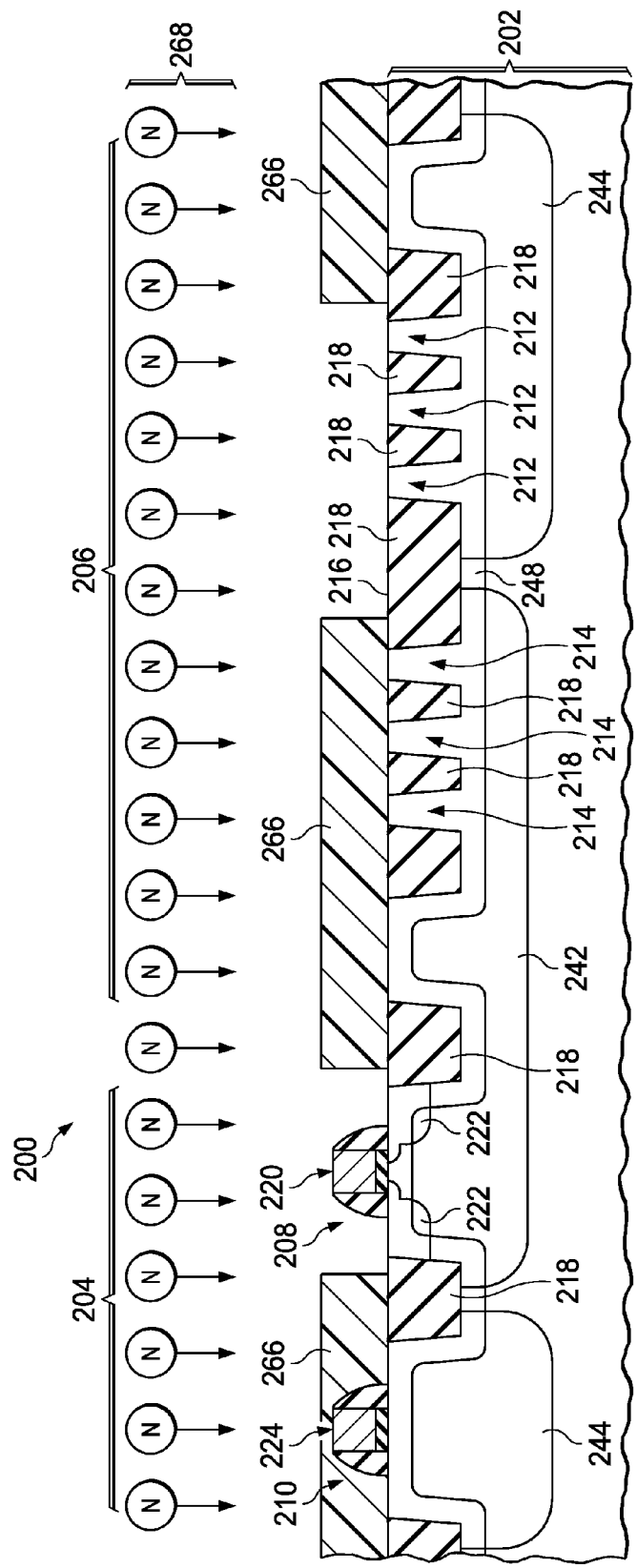

Referring to FIG. 2F, an n-channel source/drain (NSD) mask 266 is formed over an existing surface of the integrated circuit 200 so as to expose the NMOS transistor 208 and cover the PMOS transistor 210. The NSD mask 266 may optionally expose the n-type thermoelectric elements 212 as shown in FIG. 2F. N-type dopants 268 such as phosphorus, arsenic and possibly antimony are implanted into the substrate 202 in the areas exposed by the NSD mask 266. The NSD mask 266 is subsequently removed as described in reference to FIG. 2C. After the NSD mask 266 is removed, the substrate 202 is annealed so as to activate the implanted n-type dopants 268 to form n-type source/drain regions 222 in the NMOS transistor 208. If the NSD mask 266 exposed the n-type thermoelectric elements 212, the implanted n-type dopants 268 add to an n-type dopant distribution there, which advantageously reduces an electrical resistance of the n-type thermoelectric elements 212 without increasing fabrication cost and complexity of the integrated circuit 200.

Figure 2G:
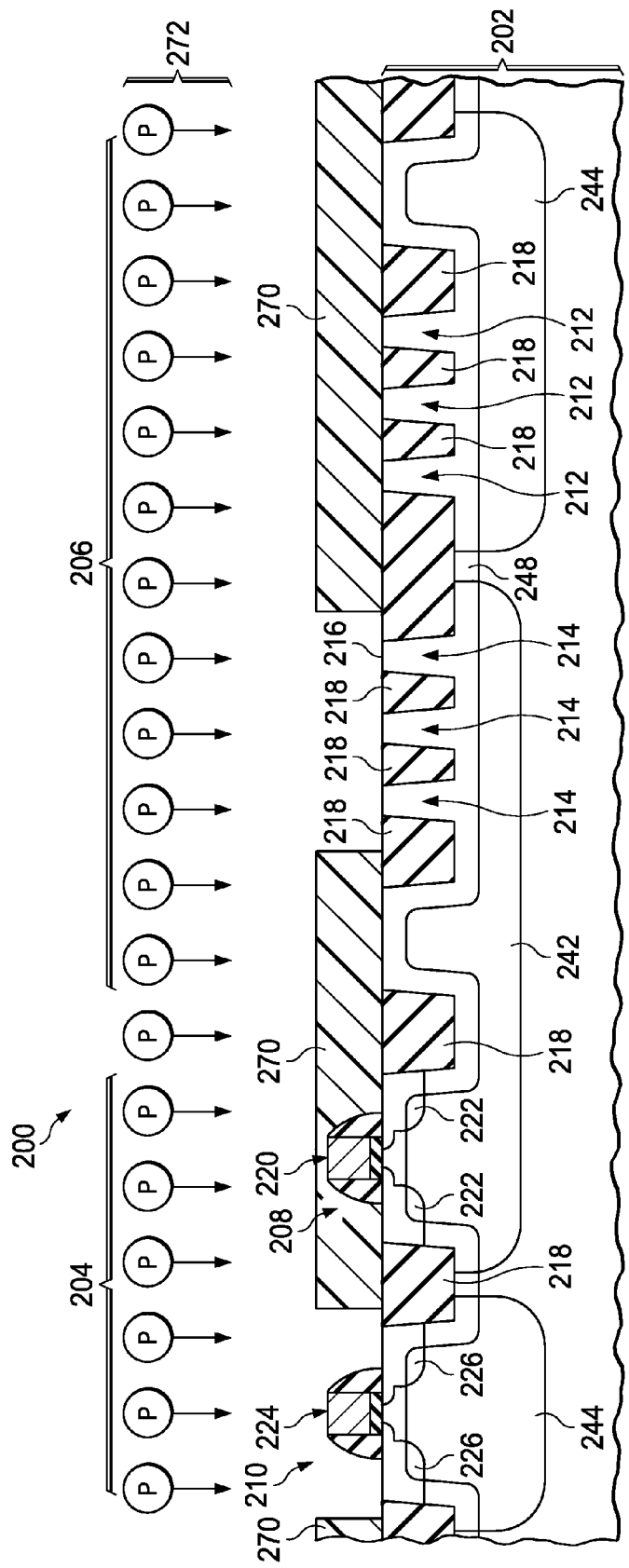

Referring to FIG. 2G, a p-channel source/drain (PSD) mask 270 is formed over an existing surface of the integrated circuit 200 so as to expose the PMOS transistor 210 and cover the NMOS transistor 208. The PSD mask 270 may optionally expose the p-type thermoelectric elements 214 as shown in FIG. 2G. P-type dopants 272 such as boron, gallium and possibly indium are implanted into the substrate 202 in the areas exposed by the PSD mask 270. The PSD mask 270 is subsequently removed as described in reference to FIG. 2C. After the PSD mask 270 is removed, the substrate 202 is annealed so as to activate the implanted p-type dopants 272 to form p-type source/drain regions 226 in the PMOS transistor 210. If the PSD mask 270 exposed the p-type thermoelectric elements 214, the implanted p-type dopants 272 add to a p-type dopant distribution there, which advantageously reduces an electrical resistance of the p-type thermoelectric elements 214 without increasing fabrication cost and complexity of the integrated circuit 200. Formation of the integrated circuit 200 is continued by formation of interconnect structures in the area of the CMOS transistors 204 and the area of the embedded thermoelectric device 206, for example similar shown in FIG. 1.

Figure 3A:
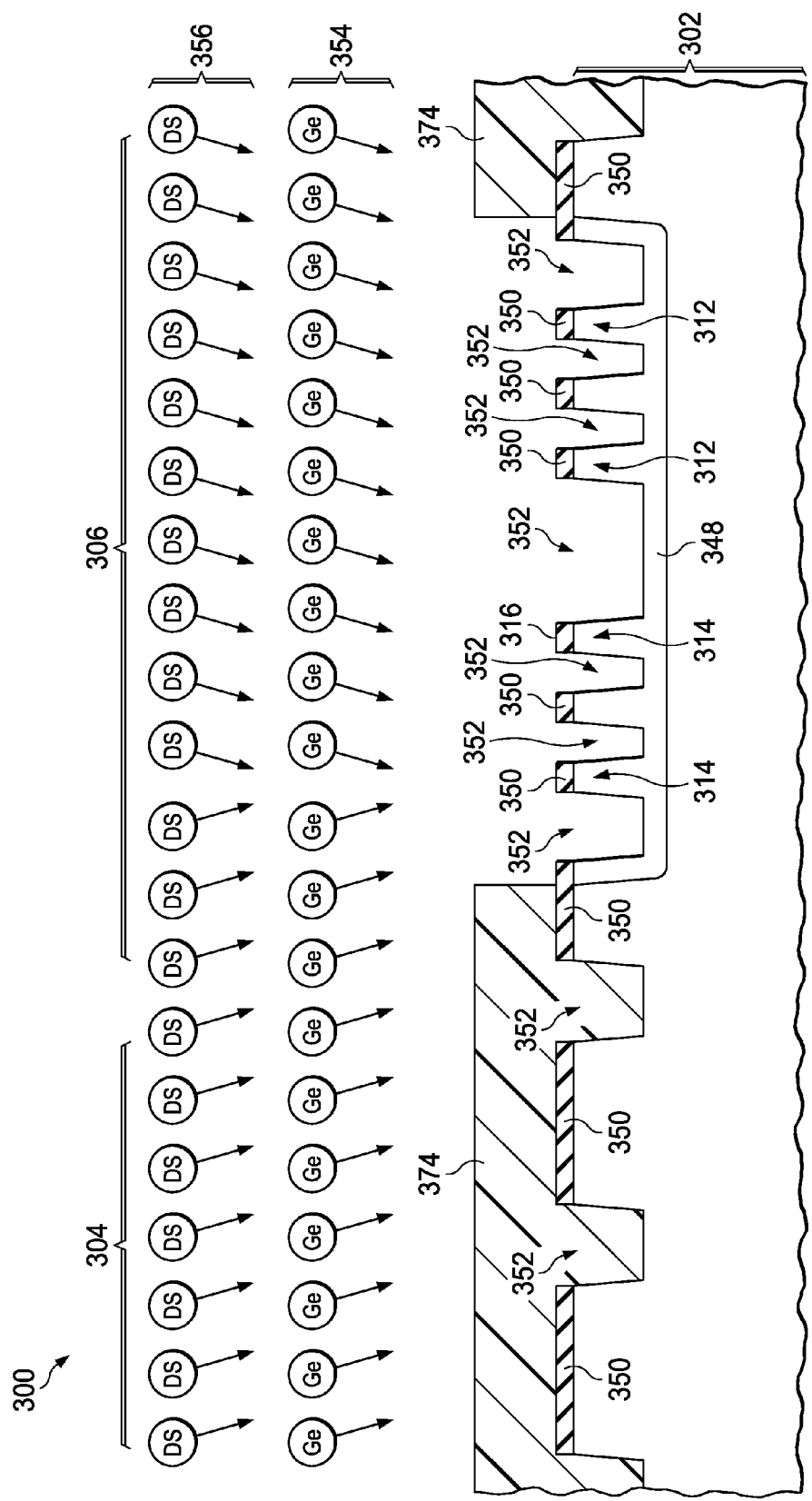
FIG. 3A and FIG. 3B are cross sections of another example integrated circuit containing CMOS transistors and an embedded thermoelectric device, depicted in successive stages of an example fabrication sequence.
Figure 3B:
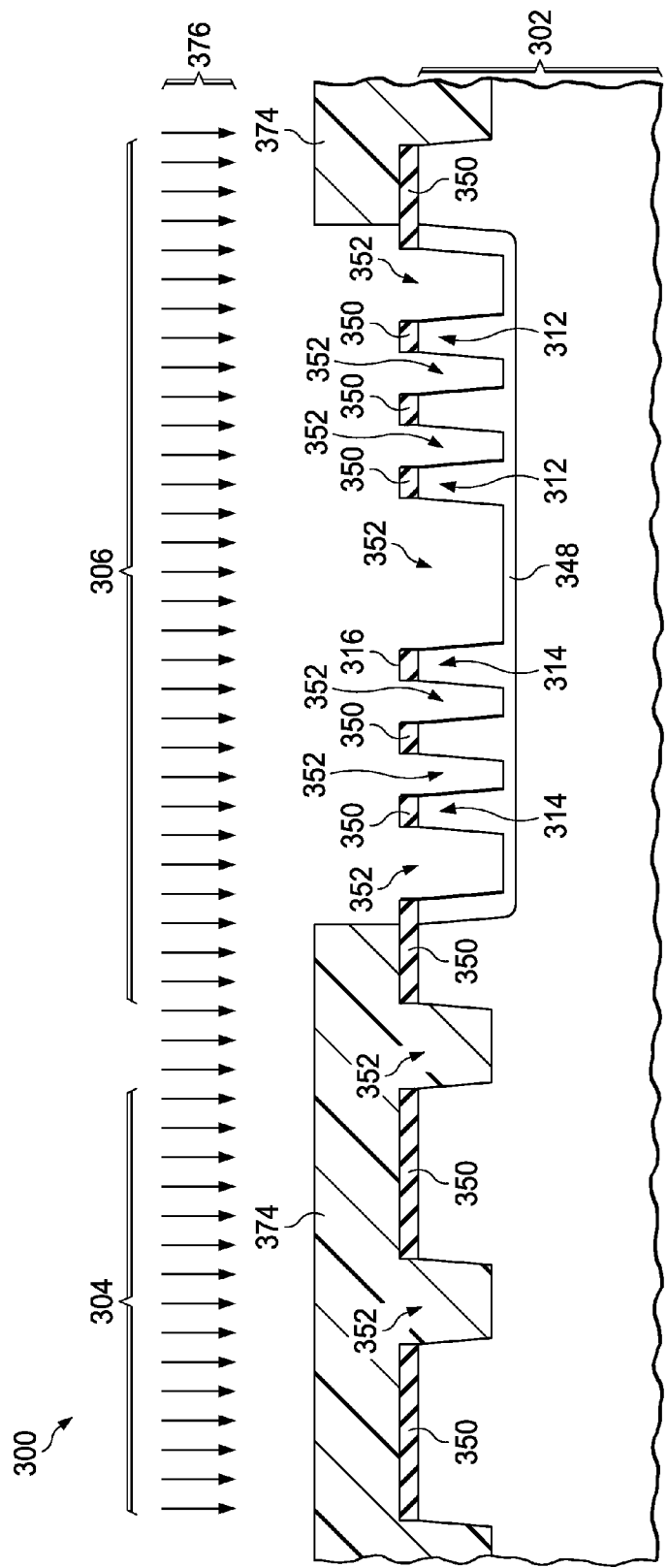

FIG. 3A and FIG. 3B are cross sections of another example integrated circuit containing CMOS transistors and an embedded thermoelectric device, depicted in successive stages of an example fabrication sequence. Referring to FIG. 3A, the integrated circuit 300 is formed on a substrate 302 including silicon-based semiconductor material. The integrated circuit 300 includes an area for the CMOS transistors 304 and an area for the embedded thermoelectric device 306. An isolation hard mask 350 is formed over the substrate 302 so as to cover active areas of the integrated circuit 300 and expose areas for subsequently-formed field oxide. Isolation trenches 352 are formed in the substrate 302 in areas exposed by the isolation hard mask 350. The active areas include areas for n-type thermoelectric elements 312 and p-type thermoelectric elements 314 of the embedded thermoelectric device 306.

A germanium implant mask 374 is formed over an existing top surface of the integrated circuit 300 so as to expose the areas for the n-type thermoelectric elements 312 and the p-type thermoelectric elements 314, and cover the area for the CMOS transistors 304. The germanium implant mask 374 may include, for example, photoresist formed by a photolithographic process, or may include silicon dioxide formed by a pattern and etch process.

Germanium 354 is implanted into the substrate 302 to form a germanium implanted region 348 along the exposed sides and bottom surfaces of the isolation trenches 352 as described in reference to FIG. 2A. The germanium 354 may be implanted with a dose sufficient to provide at least 5 atomic percent germanium in the active areas for the n-type and p-type thermoelectric elements 312 and 314. A diffusion suppressant species 356 such as carbon and/or fluorine, may optionally be implanted into the substrate 302 along the exposed sides and bottom surfaces of the isolation trenches 352 as described in reference to FIG. 2A. Forming the germanium implant mask 374 to cover the area for the CMOS transistors 304 may advantageously allow a higher density of implanted germanium 354 in the n-type thermoelectric elements 312 and the p-type thermoelectric elements 314 without degrading performance of a subsequently formed NMOS transistor and PMOS transistor. The higher density of implanted germanium 354 advantageously reduces thermal conduction in the n-type thermoelectric elements 312 and the p-type thermoelectric elements 314.

Referring to FIG. 3B, semiconductor material is removed from the substrate 202 at bottom surfaces of the isolation trenches 352 in the area for the embedded thermoelectric device 306 while significantly less material is removed from side surfaces of the isolation trenches 352, so that a thickness of the germanium implanted region 348 under the isolation trenches 352 is reduced by at least 50 percent while lateral dimensions of the n-type and p-type thermoelectric elements 312 and 314 are reduced by less than 10 percent. The semiconductor material may be removed from the bottom surfaces of the isolation trenches 352 by an anisotropic etch process 376 such as an RIE process 376. Alternatively, the side surfaces of the isolation trenches 352 may be protected with a dielectric layer prior to the semiconductor material being removed from the substrate 202 by a semi-isotropic etch process. In one version of the instant example, the semiconductor material may be removed from the bottom surfaces of the isolation trenches 352 while the germanium implant mask 374 is in place, as shown in FIG. 3B. In another version, the germanium implant mask 374 may be removed before the semiconductor material is removed, so that the semiconductor material is removed from the bottom surfaces of the isolation trenches 352 in both the area for the embedded thermoelectric device 306 and in the area for the CMOS transistors 304. Reducing the thickness of the germanium implanted region 348 under the isolation trenches 352 by at least 50 percent may advantageously decrease a thermal resistance from the n-type and p-type thermoelectric elements 312 and 314 to thermal taps of the embedded thermoelectric device 306.

Figure 4A:
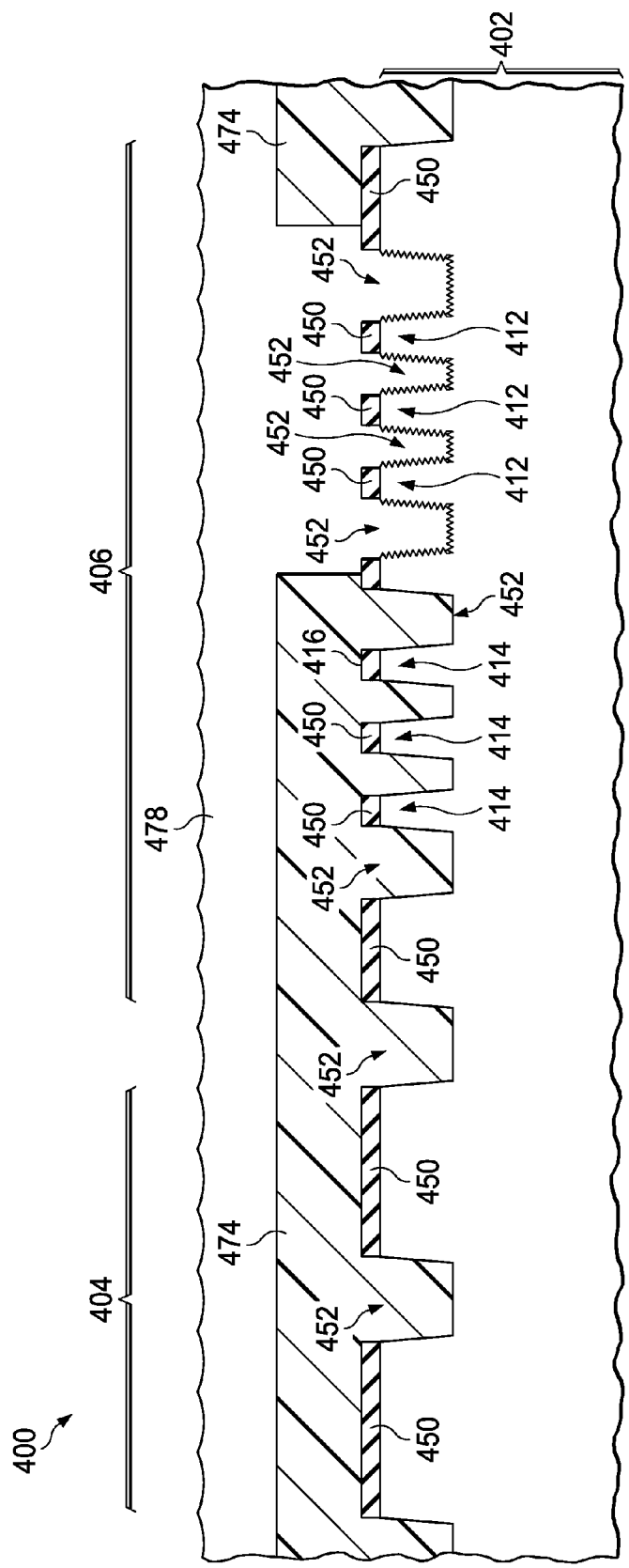
FIG. 4A and FIG. 4B are cross sections of another example integrated circuit containing CMOS transistors and an embedded thermoelectric device, depicted in successive stages of an example fabrication sequence.
Figure 4B:
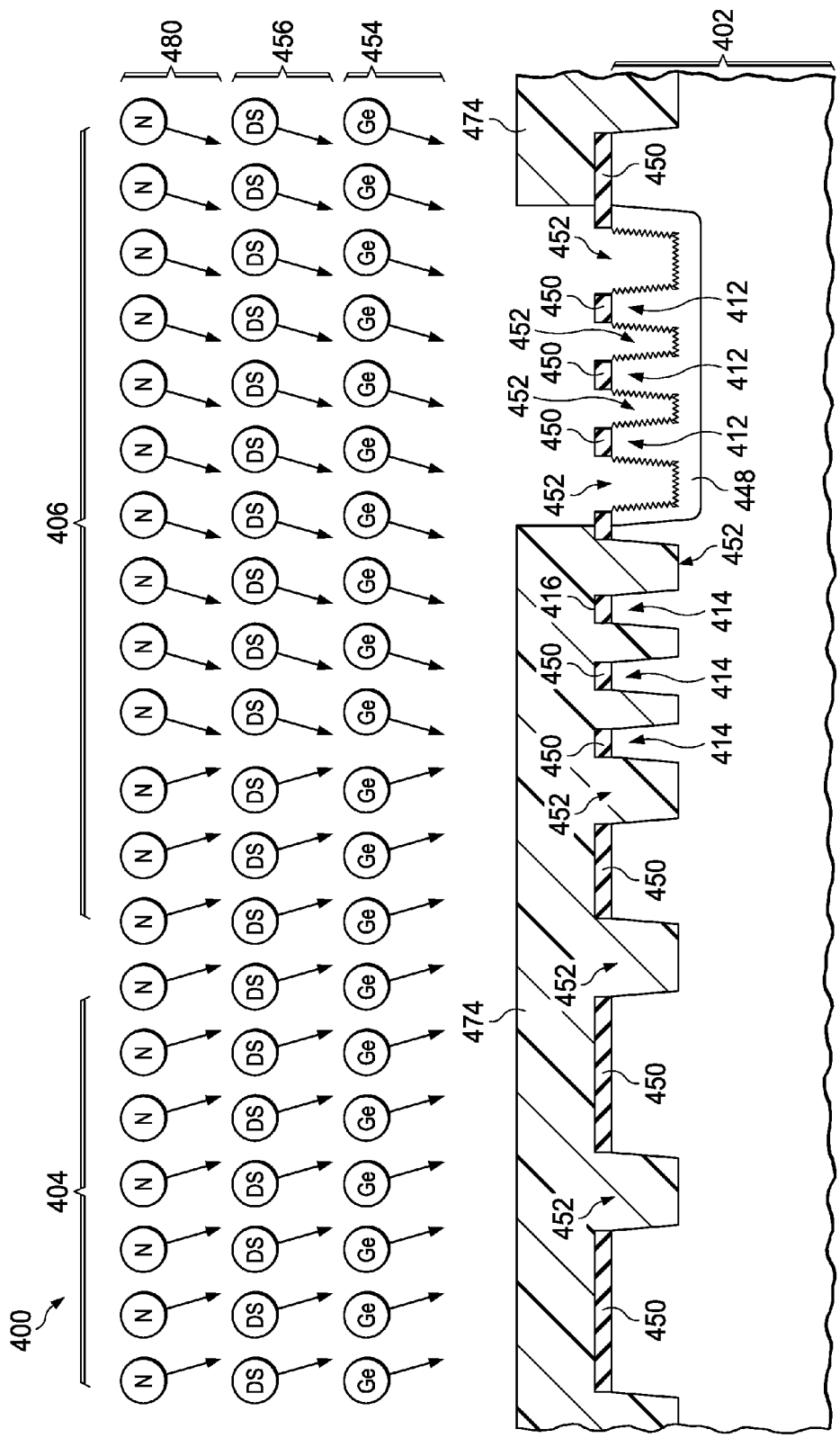

FIG. 4A and FIG. 4B are cross sections of another example integrated circuit containing CMOS transistors and an embedded thermoelectric device, depicted in successive stages of an example fabrication sequence. Referring to FIG. 4A, the integrated circuit 400 is formed on a substrate 402 including silicon-based semiconductor material. The integrated circuit 400 includes an area for the CMOS transistors 404 and an area for the embedded thermoelectric device 406. An isolation hard mask 450 is formed over the substrate 402 so as to cover active areas of the integrated circuit 400 and expose areas for subsequently-formed field oxide. Isolation trenches 452 are formed in the substrate 402 in areas exposed by the isolation hard mask 450. The active areas include areas for n-type thermoelectric elements 412 and p-type thermoelectric elements 414 of the embedded thermoelectric device 406.

A first germanium implant mask 474 is formed over an existing top surface of the integrated circuit 400 so as to expose the areas for the n-type thermoelectric elements 412 and cover the p-type thermoelectric elements 414 and the area for the CMOS transistors 404. The first germanium implant mask 474 may be formed similarly to the germanium implant mask 374 of FIG. 3A.

Side and bottom surfaces of the isolation trenches 452 exposed by the first germanium implant mask 474 are roughened by an etch process 478 such as an aqueous phosphoric acid etch process 478. Forming the roughened side surfaces of the isolation trenches 452 may advantageously reduce thermal conductance in the n-type thermoelectric elements 412 by increasing phonon scattering at the roughened surfaces.

Referring to FIG. 4B, while the first germanium implant mask 474 is in place, germanium 454 is implanted into the substrate 402 to form a first germanium implanted region 448 along the exposed sides and bottom surfaces of the isolation trenches 452 adjacent to the n-type thermoelectric elements 412. The germanium 454 may be implanted with a dose sufficient to provide at least 5 atomic percent germanium in the active areas for the n-type thermoelectric elements 412. A diffusion suppressant species 456 such as carbon and/or fluorine, may optionally be implanted into the substrate 402 along the exposed sides and bottom surfaces of the isolation trenches 452 adjacent to the n-type thermoelectric elements 412. N-type dopants 480 such as phosphorus, arsenic and/or antimony are implanted into the substrate 402 along the exposed sides and bottom surfaces of the isolation trenches 452 adjacent to the n-type thermoelectric elements 412. The n-type dopants 480 may be implanted with a dose sufficient to provide a doping density of $3 \times 10^{18}$ $cm^{-3}$ to $1 \times 10^{20}$ $cm^{-3}$ in the n-type thermoelectric elements 412. In an alternate version of the instant example, the germanium 454, the diffusion suppressant species 456 and the n-type dopants 480 may be implanted before the side and bottom surfaces of the isolation trenches 452 are roughened.

Forming the first germanium implant mask 474 to cover the area for the p-type thermoelectric elements 414 and the CMOS transistors 404 may advantageously allow a higher density of implanted germanium 454 and n-type dopants 480 in the n-type thermoelectric elements 412 without degrading performance of a subsequently formed NMOS transistor and PMOS transistor. The higher density of implanted germanium 454 advantageously reduces thermal conduction in the n-type thermoelectric elements 412. The higher density of n-type dopants 480 advantageously reduces electrical resistance in the n-type thermoelectric elements 412. Formation of the integrated circuit 400 may also include forming a second germanium implant mask which exposes the areas for the p-type thermoelectric elements 414 and cover the n-type thermoelectric elements 412 and the area for the CMOS transistors 404, followed by a roughening etch and implantation of germanium, diffusion suppressants and p-type dopants, thereby accruing similar advantages.

Figure 5A:
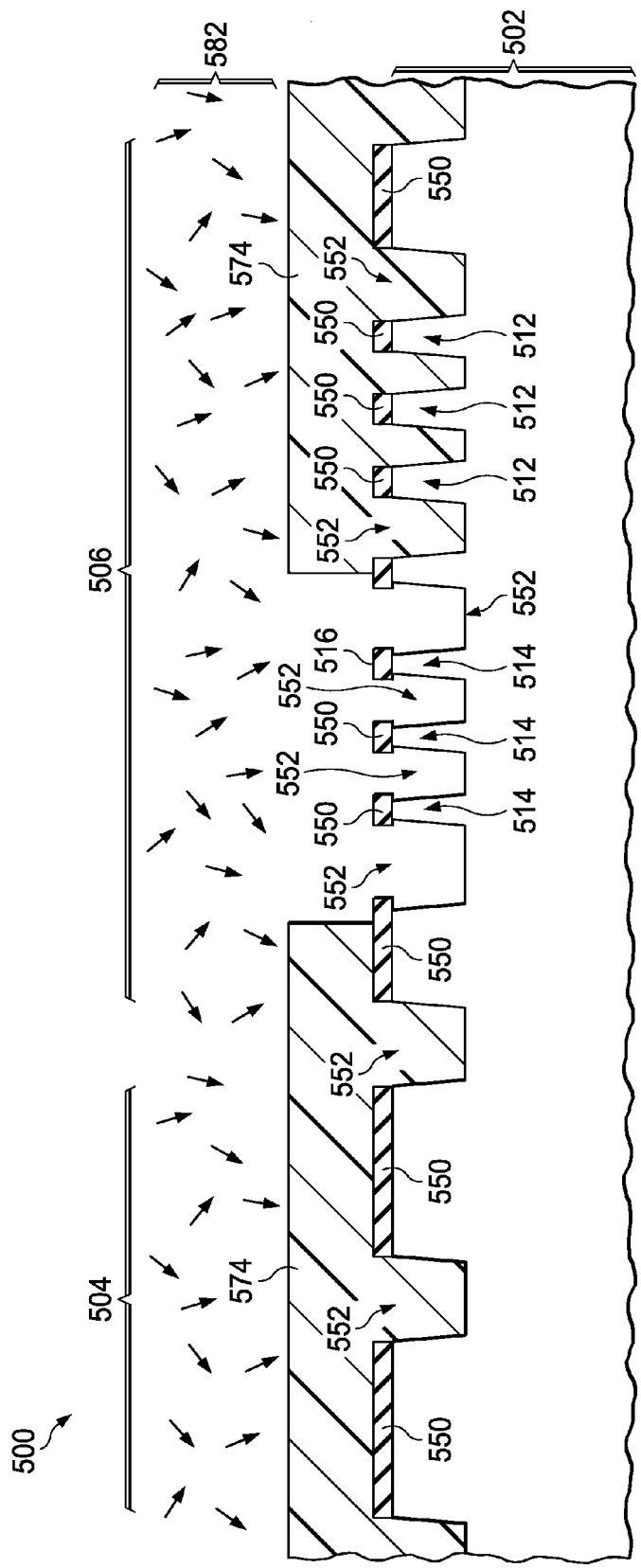
FIG. 5A and FIG. 5B are cross sections of another example integrated circuit containing CMOS transistors and an embedded thermoelectric device, depicted in successive stages of an example fabrication sequence.
Figure 5B:
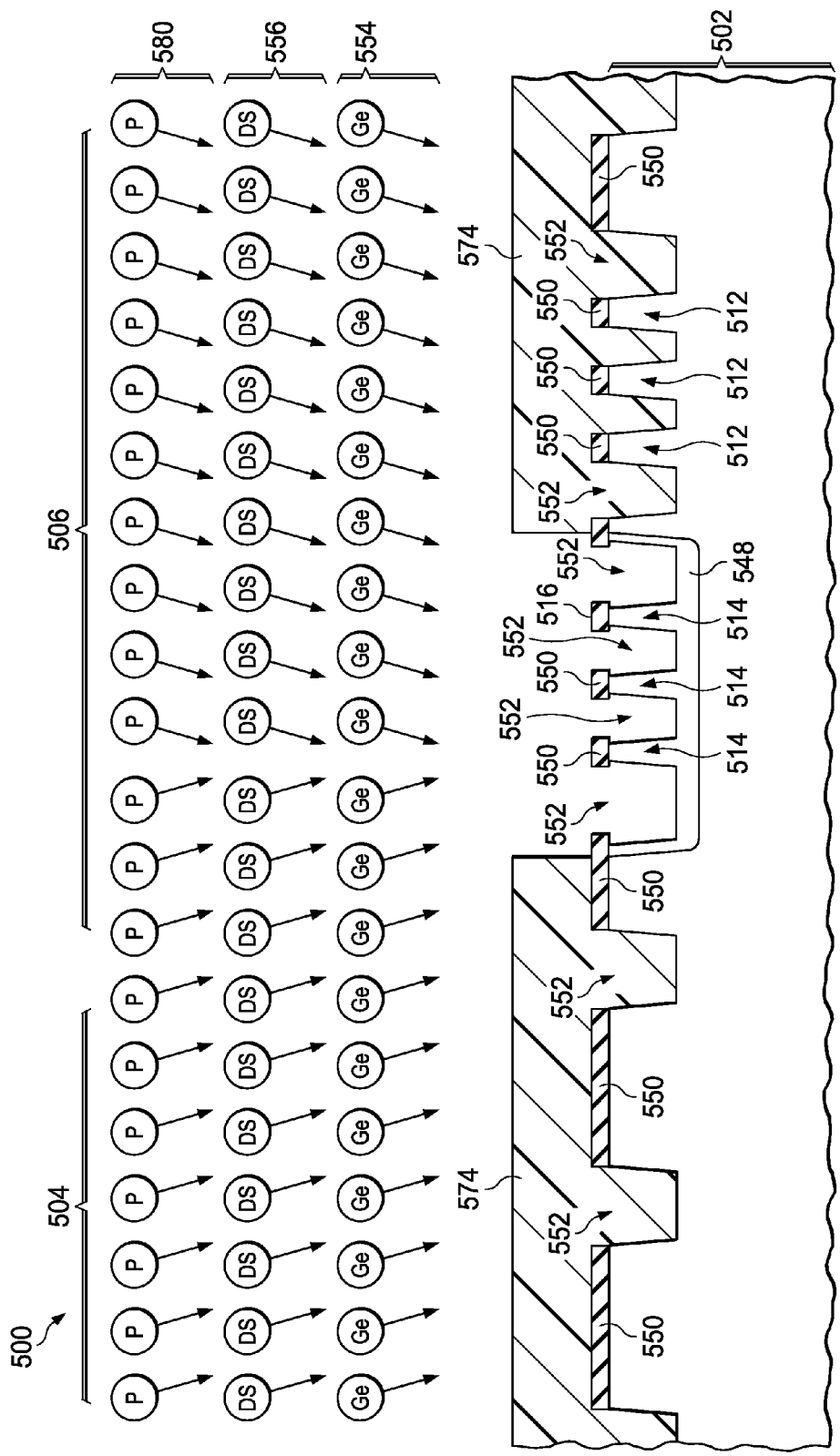

FIG. 5A and FIG. 5B are cross sections of another example integrated circuit containing CMOS transistors and an embedded thermoelectric device, depicted in successive stages of an example fabrication sequence. Referring to FIG. 5A, the integrated circuit 500 is formed on a substrate 502 including silicon-based semiconductor material, with an area for the CMOS transistors 504 and an area for the embedded thermoelectric device 506. An isolation hard mask 550 is formed over the substrate 502 so as to cover active areas of the integrated circuit 500 and expose areas for subsequently-formed field oxide. Isolation trenches 552 are formed in the substrate 502 in areas exposed by the isolation hard mask 550. The active areas include areas for n-type thermoelectric elements 512 and p-type thermoelectric elements 514 of the embedded thermoelectric device 506.

A first germanium implant mask 574 is formed over an existing top surface of the integrated circuit 500 so as to expose the areas for the p-type thermoelectric elements 514 and cover the n-type thermoelectric elements 512 and the area for the CMOS transistors 504. The first germanium implant mask 574 may be formed similarly to the germanium implant mask 374 of FIG. 3A.

Semiconductor material of the substrate 502 at side and bottom surfaces of the isolation trenches 552 exposed by the first germanium implant mask 574 is removed by an isotropic etch process 582 such as an isotropic plasma etch process 582 which reduces lateral dimensions of the p-type thermoelectric elements 514. Reducing the lateral dimensions of the p-type thermoelectric elements 514 may advantageously reduce thermal conductance in the p-type thermoelectric elements 514 by increasing phonon scattering.

Referring to FIG. 5B, while the first germanium implant mask 574 is in place, germanium 554 is implanted into the substrate 502 to form a first germanium implanted region 548 along the exposed sides and bottom surfaces of the isolation trenches 552 adjacent to the p-type thermoelectric elements 514, for example with a dose sufficient to provide at least 5 atomic percent germanium in the active areas for the p-type thermoelectric elements 514. A diffusion suppressant species 556 such as carbon and/or fluorine, may optionally be implanted as described in reference to FIG. 4B. P-type dopants 580 such as boron, gallium and/or indium are implanted into the substrate 502 along the exposed sides and bottom surfaces of the isolation trenches 552 adjacent to the p-type thermoelectric elements 514, for example with a dose sufficient to provide a doping density of $3 \times 10^{18}$ cm$^{-3}$ to $1 \times 10^{20}$ cm$^{-3}$ in the p-type thermoelectric elements 514. In an alternate version of the instant example, the germanium 554, the diffusion suppressant species 556 and the p-type dopants 580 may be implanted before the lateral dimensions of the p-type thermoelectric elements 514 are reduced.

Forming the first germanium implant mask 574 to cover the area for the n-type thermoelectric elements 512 and the CMOS transistors 504 may accrue the advantages described in reference to FIG. 4B. Formation of the integrated circuit 500 may also include forming a second germanium implant mask which exposes the areas for the n-type thermoelectric elements 512 and cover the p-type thermoelectric elements 514 and the area for the CMOS transistors 504, followed by reducing lateral dimensions of the n-type thermoelectric elements 512 and implantation of germanium, diffusion suppressants and n-type dopants, thereby accruing similar advantages.

Figure 6A:
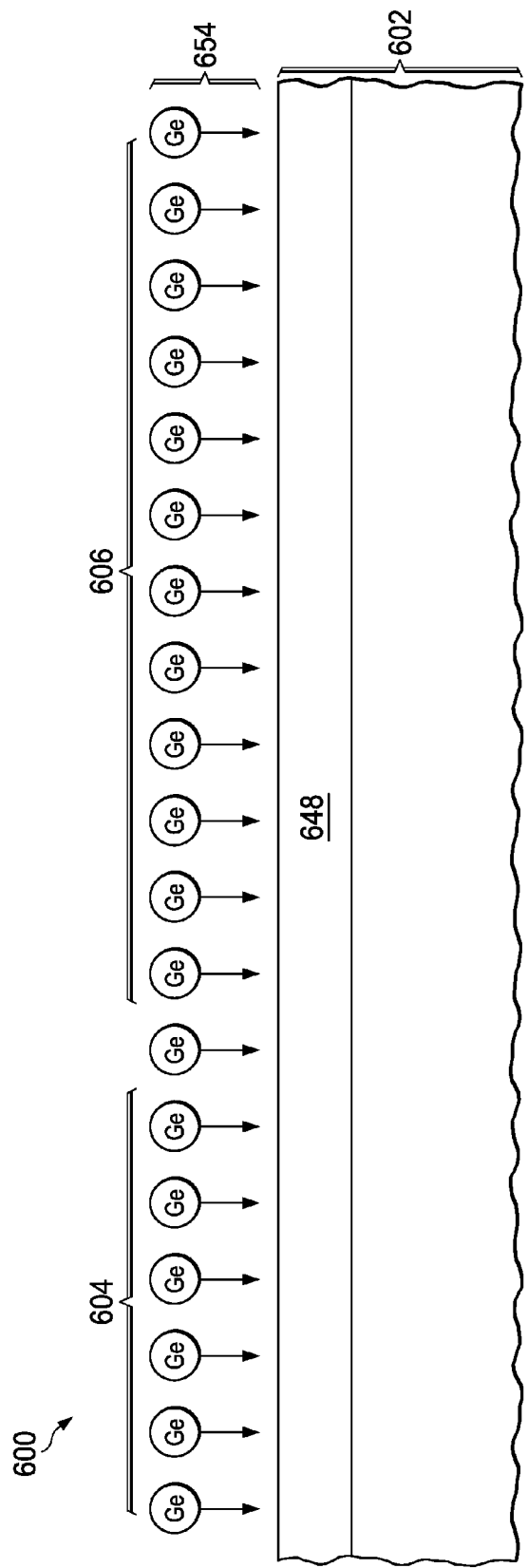
FIG. 6A and FIG. 6B are cross sections of another example integrated circuit containing CMOS transistors and an embedded thermoelectric device, depicted in successive stages of an example fabrication sequence.
Figure 6B:
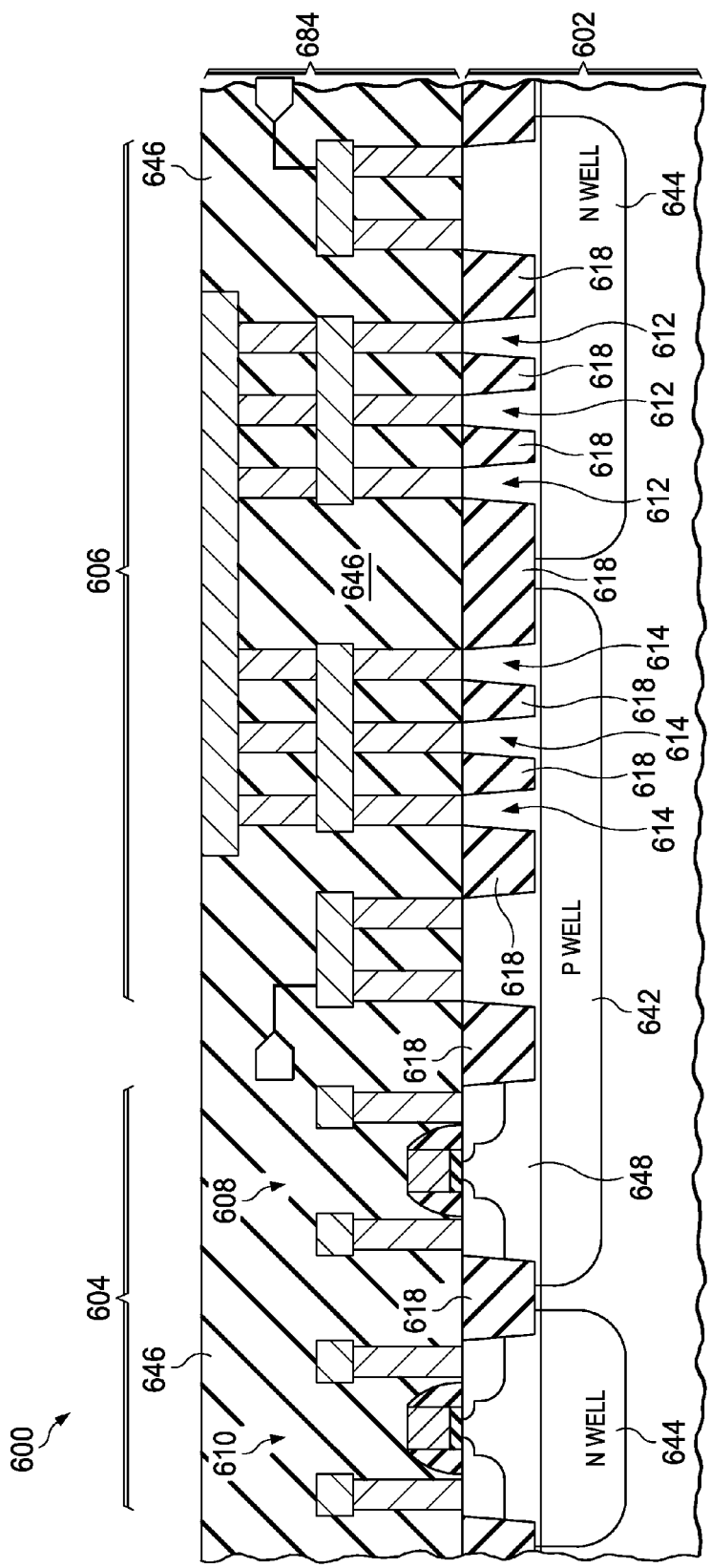

FIG. 6A and FIG. 6B are cross sections of another example integrated circuit containing CMOS transistors and an embedded thermoelectric device, depicted in successive stages of an example fabrication sequence. Referring to FIG. 6A, the integrated circuit 600 is formed on a substrate 602 including silicon-based semiconductor material. The integrated circuit 600 includes an area for the CMOS transistors 604 and an area for the embedded thermoelectric device 606. Before isolation trenches are formed in the substrate 602, germanium 654 is blanket implanted into the substrate 602 to form a blanket germanium implanted region 648 which extends across the area for the CMOS transistors 604 and the area for the embedded thermoelectric device 606. The germanium 654 may be implanted with a total dose sufficient to provide at least 1 atomic percent germanium in the blanket germanium implanted region 648. The germanium 654 may be implanted in a series of steps with energies to provide a desired uniformity of a distribution of the implanted germanium 654 throughout a depth encompassing to-be-formed thermoelectric elements of the embedded thermoelectric device 606. In one version of the instant example, the germanium 654 may be implanted so as to provide a final depth of the blanket germanium implanted region 648 which is approximately as deep as to-be-formed field oxide. Diffusion suppressant species may optionally be implanted into the substrate 602. Implanting the germanium 654 using the blanket implant process may advantageously reduce fabrication cost and complexity of the integrated circuit 600.

Referring to FIG. 6B, field oxide 618 is formed in the substrate 602 so as to define active areas for an NMOS transistor 608 and a PMOS transistor 610 in the area for the CMOS transistors 604 and for n-type thermoelectric elements 612 and p-type thermoelectric elements 614 of the embedded thermoelectric device 606. In one version of the instant example, the blanket germanium implanted region 648 extends approximately as deep as the field oxide 618, which may advantageously reduce thermal resistance of the substrate 602 between adjacent instances of the n-type thermoelectric elements 612 and the p-type thermoelectric elements 614. One or more p-type wells 642 are formed in the substrate 602 under the NMOS transistor 608 and the p-type thermoelectric elements 614. One or more n-type wells 644 are formed in the substrate 602 under the PMOS transistor 608 and the n-type thermoelectric elements 612. A dielectric layer stack 646 and metal interconnects 684 are formed over the substrate 602 to provide interconnects to the NMOS and PMOS transistors 608 and 610 and the embedded thermoelectric device 606.

In an alternate version of the instant example, the germanium 654 may be blanket implanted into the substrate 602 after the field oxide 618 is formed. Similar advantages of reduced fabrication cost and complexity of the integrated circuit 600 may be accrued.

Figure 7A:
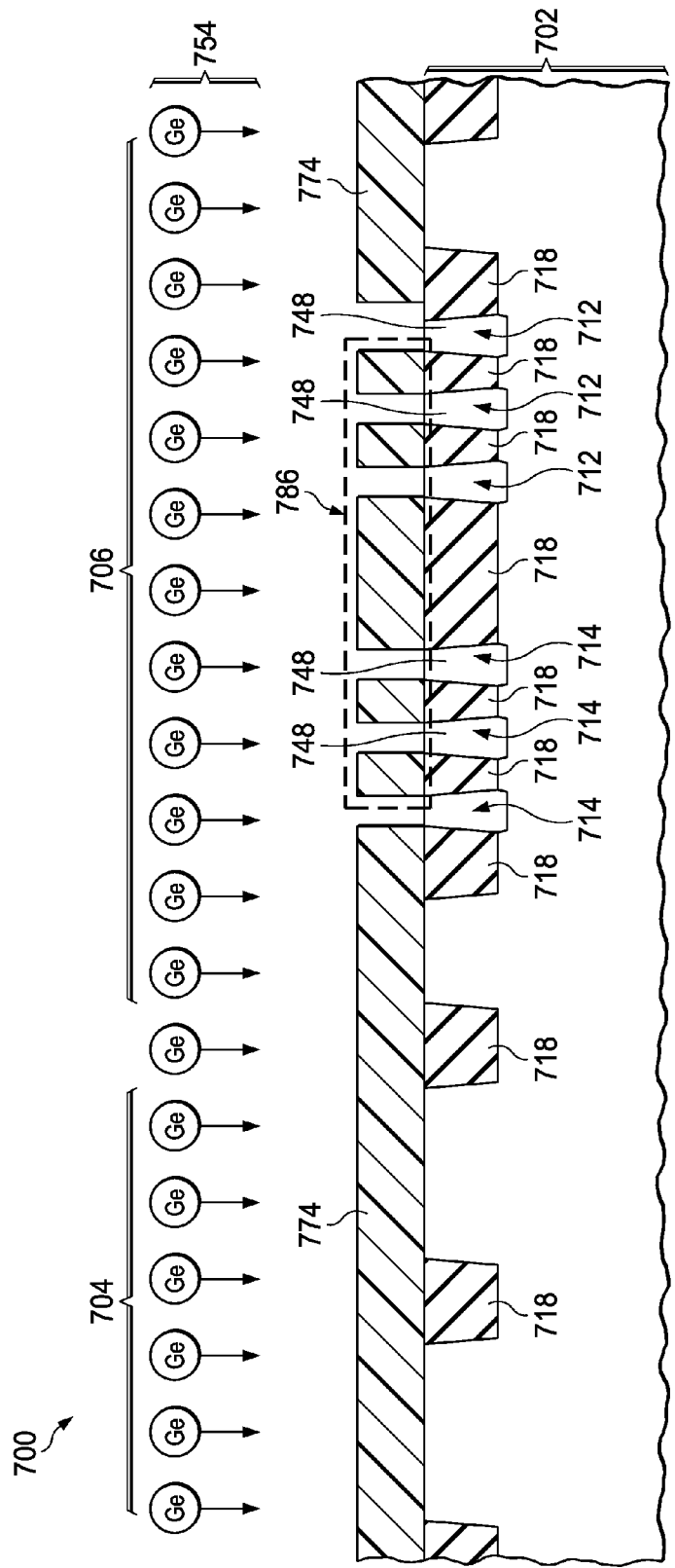
FIG. 7A and FIG. 7B are cross sections of another example integrated circuit containing CMOS transistors and an embedded thermoelectric device, depicted in successive stages of an example fabrication sequence.
Figure 7B:
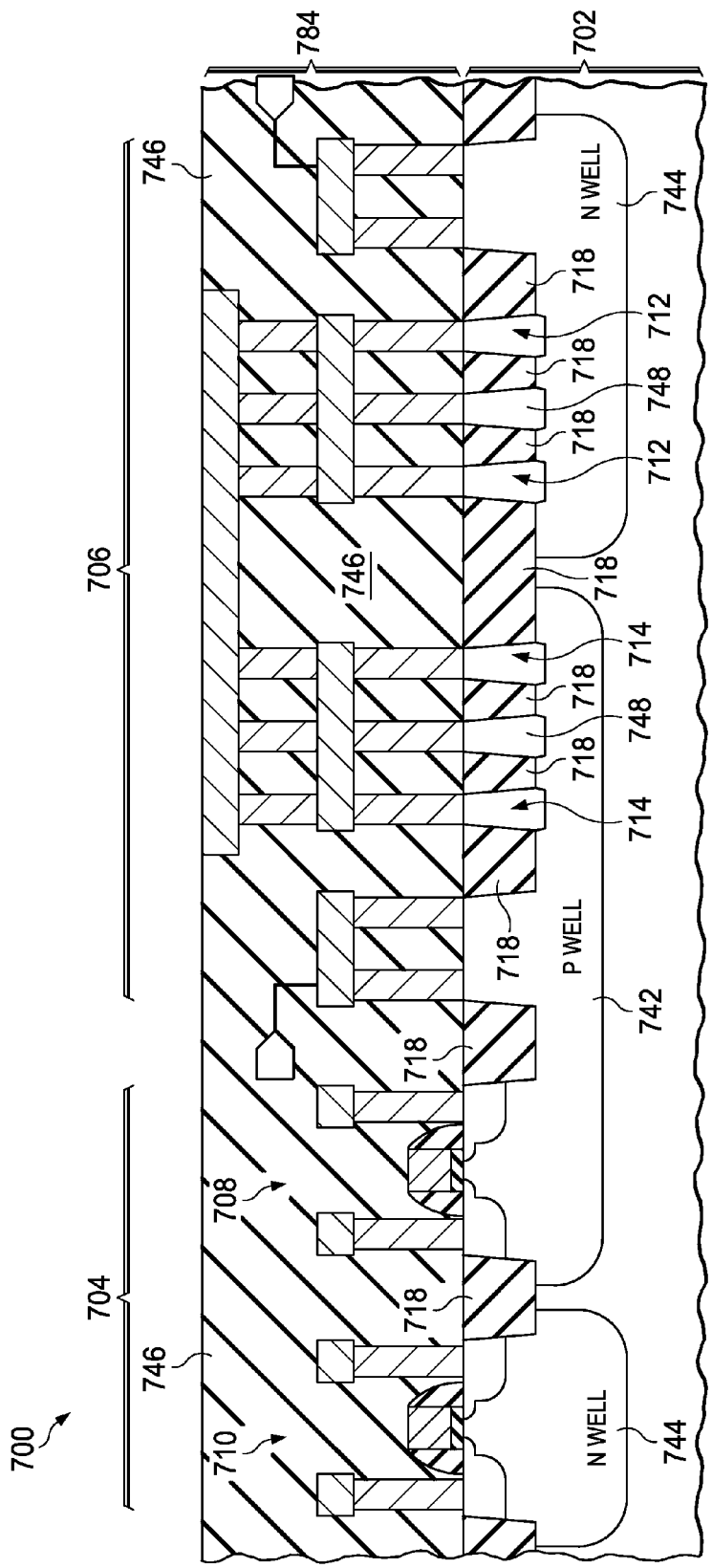

FIG. 7A and FIG. 7B are cross sections of another example integrated circuit containing CMOS transistors and an embedded thermoelectric device, depicted in successive stages of an example fabrication sequence. Referring to FIG. 7A, the integrated circuit 700 is formed on a substrate 702 including silicon-based semiconductor material. The integrated circuit 700 includes an area for the CMOS transistors 704 and an area for the embedded thermoelectric device 706. Field oxide 718 is formed in the substrate 702 so as to define active areas for an NMOS transistor 708 and a PMOS transistor 710 in the area for the CMOS transistors 704 and for n-type thermoelectric elements 712 and p-type thermoelectric elements 714 of the embedded thermoelectric device 706. A germanium implant mask 774 is formed over an existing top surface of the integrated circuit 700 so as to expose the areas for the n-type thermoelectric elements 712 and the p-type thermoelectric elements 714, and cover the area for the CMOS transistors 704. The germanium implant mask 774 may be formed as described in reference to FIG. 3A. The germanium implant mask 774 may include optional blocking elements 786 which are disposed over the field oxide 718 in the embedded thermoelectric device 706 so as to block germanium from the substrate 702 between adjacent instances of the n-type thermoelectric elements 712 and the p-type thermoelectric elements 714. Germanium 754 is implanted into the substrate 702 in areas exposed by the germanium implant mask 774 to form a germanium implanted region 748 in the area for the embedded thermoelectric device 706. If the optional blocking elements 786 are formed, the germanium implanted region 748 may be limited to the n-type and p-type thermoelectric elements 712 and 714, as depicted in FIG. 7A. The germanium 754 may be implanted with a total dose sufficient to provide at least 5 atomic percent germanium in the blanket germanium implanted region 748. The germanium 754 may be implanted in a series of steps with energies to provide a desired uniformity of a distribution of the implanted germanium 754 throughout a depth encompassing the n-type thermoelectric elements 712 and the p-type thermoelectric elements 714. Diffusion suppressant species may optionally be implanted into the substrate 702. Forming the germanium implant mask 774 to spatially limit the implanted germanium 754 may advantageously allow a higher density of implanted germanium 754 in the n-type and p-type thermoelectric elements 712 and 714 without degrading performance of a subsequently formed NMOS transistor and PMOS transistor, as explained in reference to FIG. 3B. Forming the blocking elements 786 may advantageously prevent the implanted germanium 754 from reducing thermal conductivity of the substrate 702 between adjacent instances of the n-type and p-type thermoelectric elements 712 and 714, thus improving performance of the embedded thermoelectric device 706.

Referring to FIG. 7B, One or more p-type wells 742 are formed in the substrate 702 under the NMOS transistor 708 and the p-type thermoelectric elements 714. One or more n-type wells 744 are formed in the substrate 702 under the PMOS transistor 708 and the n-type thermoelectric elements 712. A dielectric layer stack 746 and metal interconnects 784 are formed over the substrate 702 to provide interconnects to the NMOS and PMOS transistors 708 and 710 and the embedded thermoelectric device 706.

In an alternate version of the instant example, the germanium 754 may be blanket implanted into the substrate 702 after the p-type wells 742 and the n-type wells 744 are formed. In an alternate version of the instant example, the germanium 754 may be blanket implanted into the substrate 702 before the field oxide 718 is formed. In an alternate version of the instant example, the germanium 754 may be blanket implanted into the substrate 702 after the p-type wells 742 and the n-type wells 744 are formed. Similar advantages of improved performance of the embedded thermoelectric device 706 may be accrued.

Figure 8:
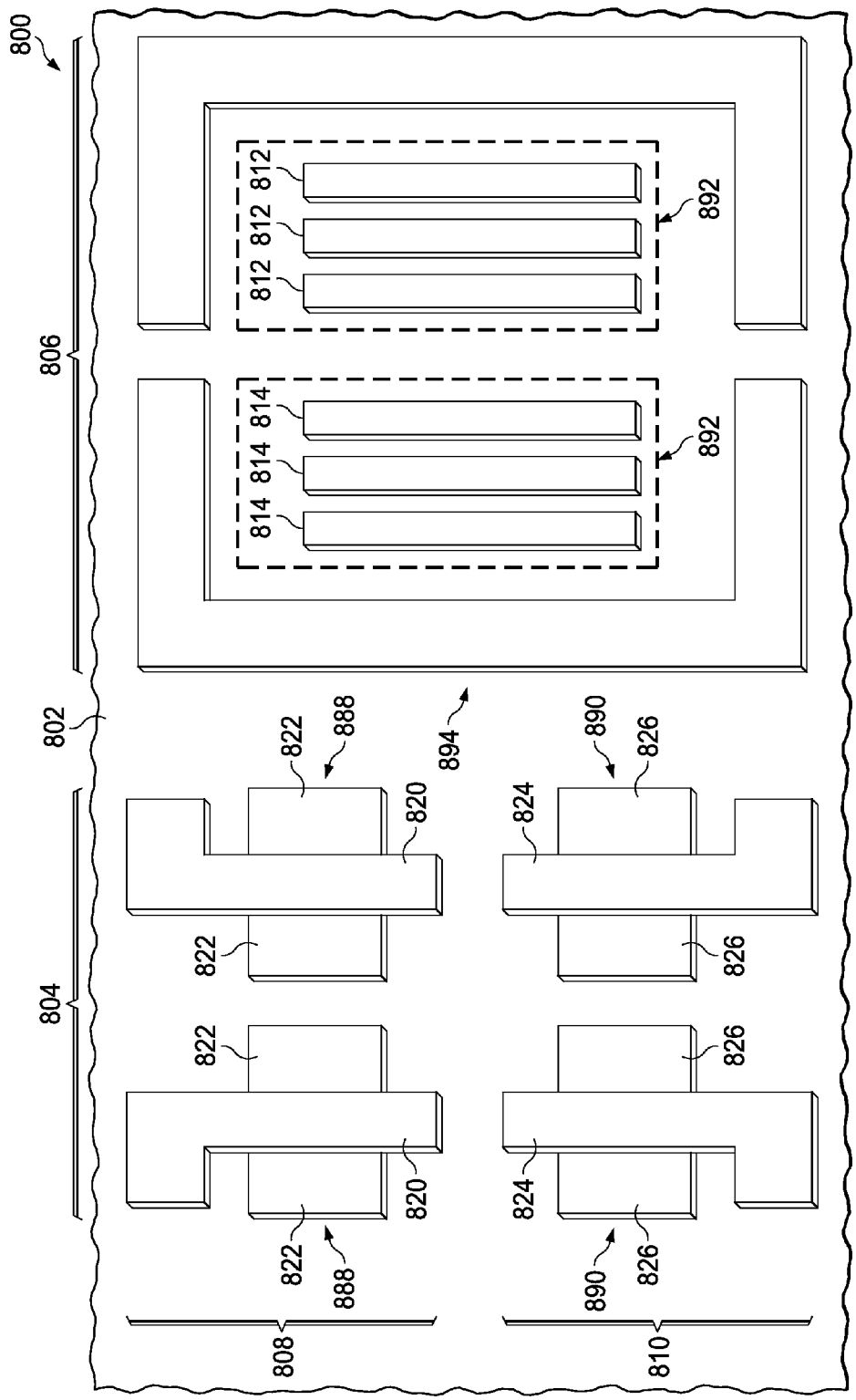
FIG. 8 and FIG. 9 are top views of example integrated circuits containing CMOS transistors and embedded thermoelectric devices.
Figure 9:
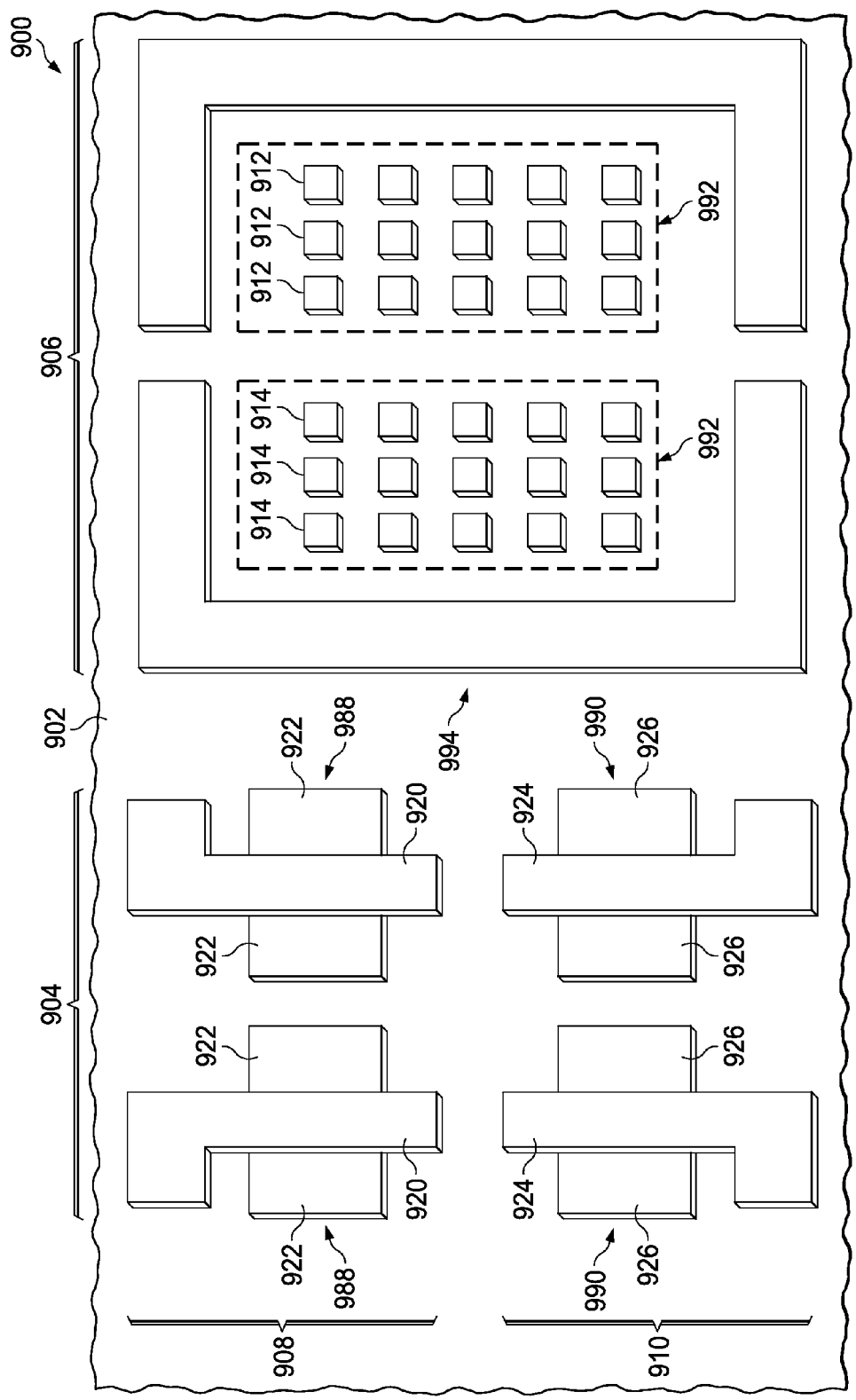

FIG. 8 and FIG. 9 are top views of example integrated circuits containing CMOS transistors and embedded thermoelectric devices. Referring to FIG. 8, the integrated circuit 800 is formed on a substrate 802 including silicon-based semiconductor material. Field oxide is not shown in FIG. 8 to more clearly show the active areas of the integrated circuit 800. The integrated circuit 800 includes an area for the CMOS transistors 804 and an area for the embedded thermoelectric device 806.

The CMOS transistors 804 include NMOS transistors 808 and PMOS transistors 810. The NMOS transistors 808 are formed on active areas 888 and include n-type source/drain regions 822 in the active areas 888 and gate structures 820 over the active areas 888. The PMOS transistors 810 are formed on active areas 890 and include p-type source/drain regions 826 in the active areas 890 and gate structures 824 over the active areas 890.

The embedded thermoelectric device 806 includes n-type thermoelectric elements 812 and p-type thermoelectric elements 814 in arrays of linear active areas 892. An active area 894 may surround the n-type and p-type thermoelectric elements 812 and 814 to provide a thermal connection from the substrate 802 to thermal taps to terminals of the embedded thermoelectric device 806. Configuring the n-type and p-type thermoelectric elements 812 and 814 in the arrays of linear active areas 892 may provide higher thermoelectric power generation density per unit area compared to other configurations of the arrays of the n-type and p-type thermoelectric elements 812 and 814. The integrated circuit 800 may be formed by any of the example process sequences described herein.

Referring to FIG. 9, the integrated circuit 900 is formed on a substrate 902 including silicon-based semiconductor material. Field oxide is not shown in FIG. 9 to more clearly show the active areas of the integrated circuit 900. The integrated circuit 900 includes an area for the CMOS transistors 904 and an area for the embedded thermoelectric device 906.

The CMOS transistors 904 include NMOS transistors 908 and PMOS transistors 910. The NMOS transistors 908 are formed on active areas 988 and include n-type source/drain regions 922 in the active areas 988 and gate structures 920 over the active areas 988. The PMOS transistors 910 are formed on active areas 990 and include p-type source/drain regions 926 in the active areas 990 and gate structures 924 over the active areas 990.

The embedded thermoelectric device 906 includes n-type thermoelectric elements 912 and p-type thermoelectric elements 914 in arrays of pillar active areas 992. An active area 994 may surround the n-type and p-type thermoelectric elements 912 and 914 to provide a thermal connection from the substrate 902 to thermal taps to terminals of the embedded thermoelectric device 906. Configuring the n-type and p-type thermoelectric elements 912 and 914 in the arrays of pillar active areas 992 may provide higher thermoelectric power generation efficiency compared to other configurations of the arrays of the n-type and p-type thermoelectric elements 912 and 914, due to reduced thermal conduction in the pillar active areas 992 from phono scattering at sides of the pillar active areas 992. The integrated circuit 900 may be formed by any of the example process sequences described herein.

Although illustrative embodiments have been shown and described by way of example, a wide range of alternative embodiments is possible within the scope of the foregoing disclosure.

What is claimed is:
1. An integrated circuit, comprising:
a substrate comprising a single-crystal silicon wafer;

field oxide in isolation trenches in the substrate, the field oxide providing lateral isolation for an n-channel metal oxide semiconductor (NMOS) transistor and a p-channel metal oxide semiconductor (PMOS) transistor in an area for complementary metal oxide semiconductor (CMOS) transistors of the integrated circuit, and providing lateral isolation for n-type thermoelectric elements and p-type thermoelectric elements of an embedded thermoelectric device of the integrated circuit;

a metal interconnect structure which connects upper ends of the n-type thermoelectric elements and the p-type thermoelectric elements to a thermal node; and a germanium implanted region in the substrate encompassing the n-type thermoelectric elements and the p-type thermoelectric elements, the germanium implanted region having at least 0.10 atomic percent germanium in the n-type thermoelectric elements and the p-type thermoelectric elements, wherein the germanium implanted region extends approximately as deep in the substrate as the field oxide.

2. The integrated circuit of claim 1, wherein the germanium implanted region having at least 1 atomic percent germanium in the n-type thermoelectric elements and the p-type thermoelectric elements.

3. The integrated circuit of claim 1, wherein the germanium implanted region having at least 3 atomic percent germanium in the n-type thermoelectric elements and the p-type thermoelectric elements.

4. The integrated circuit of claim 1, wherein the germanium implanted region extends across the area for the CMOS transistors.

5. The integrated circuit of claim 1, wherein the germanium implanted region includes a diffusion suppressant species with a density of at least $1 \times 10^{20}$ cm$^{-3}$ in the n-type thermoelectric elements and the p-type thermoelectric elements, the diffusion suppressant species being selected from the group consisting of fluorine and carbon.

* * * * *